(12) United States Patent
Cheung et al.

(10) Patent No.: US 11,588,298 B2
(45) Date of Patent: Feb. 21, 2023

(54) COUPLED-CAVITY VCSELS FOR ENHANCED MODULATION BANDWIDTH

(71) Applicant: HEWLETT PACKARD ENTERPRISE DEVELOPMENT LP, Houston, TX (US)

(72) Inventors: Stanley Cheung, Palo Alto, CA (US); Michael Renne Ty Tan, Palo Alto, CA (US); Binhao Wang, Palo Alto, CA (US); Wayne Victor Sorin, Palo Alto, CA (US); Chao-Kun Lin, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 326 days.

(21) Appl. No.: 16/909,991

(22) Filed: Jun. 23, 2020

(65) Prior Publication Data

US 2021/0399522 A1    Dec. 23, 2021

(51) Int. Cl.
*H01S 5/14* (2006.01)
*H01S 5/183* (2006.01)
(Continued)

(52) U.S. Cl.
CPC ............ *H01S 5/141* (2013.01); *H01S 5/0687* (2013.01); *H01S 5/1014* (2013.01); *H01S 5/1025* (2013.01); *H01S 5/18305* (2013.01)

(58) Field of Classification Search
CPC ...... H01S 5/141; H01S 5/0687; H01S 5/1025; H01S 5/18305
See application file for complete search history.

(56) References Cited

U.S. PATENT DOCUMENTS 8,116,171 B1 *   2/2012   Lee .................. G11B 5/314
                                              369/13.01
10,141,718 B2   11/2018   Garnache-Creuillot et al.
(Continued)

FOREIGN PATENT DOCUMENTS

WO    WO-2009134456    11/2009

OTHER PUBLICATIONS

Gu, X. et al.; "850 nm transverse-coupled-cavity vertical-cavity surface-emitting laser with direct modulation bandwidth of over 30 GHz"; Applied Physics Express; Jul. 23, 2015; 5 pgs.; vol. 8; The Japan Society of Applied Physics.
(Continued)

*Primary Examiner* — Yuanda Zhang
(74) *Attorney, Agent, or Firm* — Sheppard Mullin Richter & Hampton LLP

(57) ABSTRACT

Coupled-cavity vertical cavity surface emitting lasers (VCSELs) are provided by the present disclosure. The coupled-cavity VCSEL can comprise a VCSEL having a first mirror, a gain medium disposed above the first mirror, and a second mirror disposed above the gain medium, wherein a first cavity is formed by the first mirror and the second mirror. A second cavity is optically coupled to the VCSEL and configured to reflect light emitted from the VCSEL back into the first cavity of the VCSEL. In some embodiments, the second cavity can be an external cavity optically coupled to the VCSEL through a coupling component. In some embodiments, the second cavity can be integrated with the VCSEL to form a monolithic coupled-cavity VCSEL. A feedback circuit can control operation of the coupled-cavity VCSEL so the output comprises a target high frequency signal.

20 Claims, 6 Drawing Sheets

(51) Int. Cl.
*H01S 5/10* (2021.01)
*H01S 5/0687* (2006.01)

(56) References Cited

U.S. PATENT DOCUMENTS

| | | | |
|---|---|---|---|
| 10,290,996 B1* | 5/2019 | Mathai | H01S 5/18388 |
| 2008/0247436 A1* | 10/2008 | Carter | H01S 5/0683 |
| | | | 372/50.11 |
| 2012/0327754 A1* | 12/2012 | Olson | G11B 5/105 |
| | | | 372/50.1 |
| 2017/0256915 A1 | 9/2017 | Ghosh | |
| 2020/0366058 A1* | 11/2020 | Kawakita | H01S 5/068 |

OTHER PUBLICATIONS

Ibrahim, H. R. et al.; "Modulation Bandwidth Enhancement of Double Transverse Coupled Cavity VCSELs"; 21st Microoptics Conference (MOC'16), Oct. 12-14, 2016; 3 pgs.; The Japan Society of Applied Physics; Berkeley, California, USA.

Yang, S. et al.; "Wavelength Tuning of Vertical-Cavity Surface-Emitting Lasers by an Internal Device Heater"; IEEE Photonics Technology Letters, Oct. 15, 2005; pp. 1679-1681; vol. 20; issue 20; IEEE.

* cited by examiner

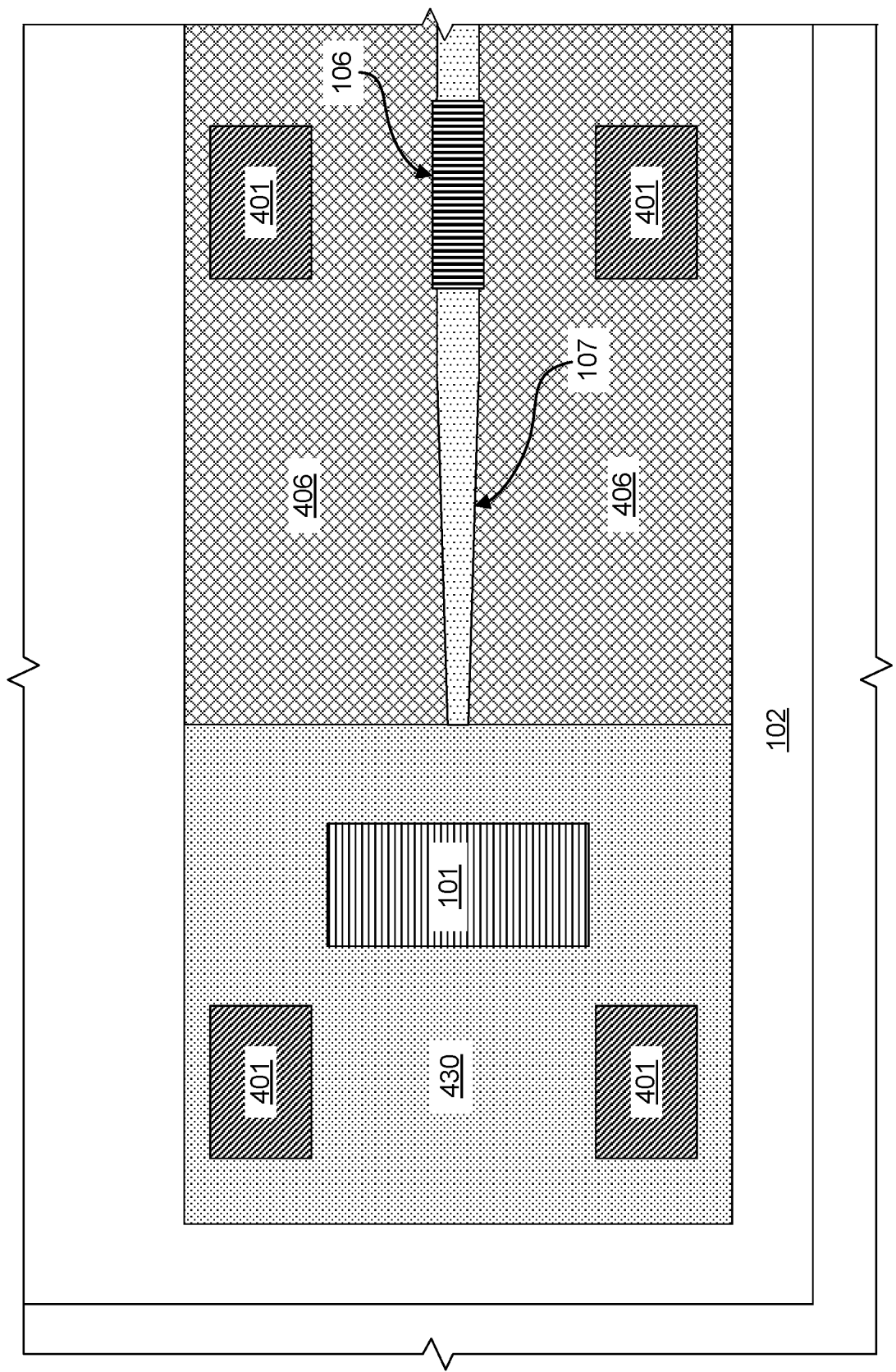

COUPLED-CAVITY VCSELS FOR ENHANCED MODULATION BANDWIDTH

DESCRIPTION OF RELATED ART

Vertical cavity surface emitting lasers (VCSELs) are semiconductor-based diodes configured to emit light or an optical beam vertically. VCSELs can either be top-emitting, wherein the signal is emitted vertically through the top surface of the VCSEL, or bottom-emitting, wherein the signal is emitted vertically through the bottom surface. The vertical emission character of VCSELs make them well-suited for fabrication of semiconductor wafer-based device, wherein a single die can be created with hundreds of individual light sources and more easily tested than edge emitting lasers.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 3B illustrates a top view of the example coupled-cavity VCSEL system in accordance with embodiments of the technology disclosed herein.

Figure 1:
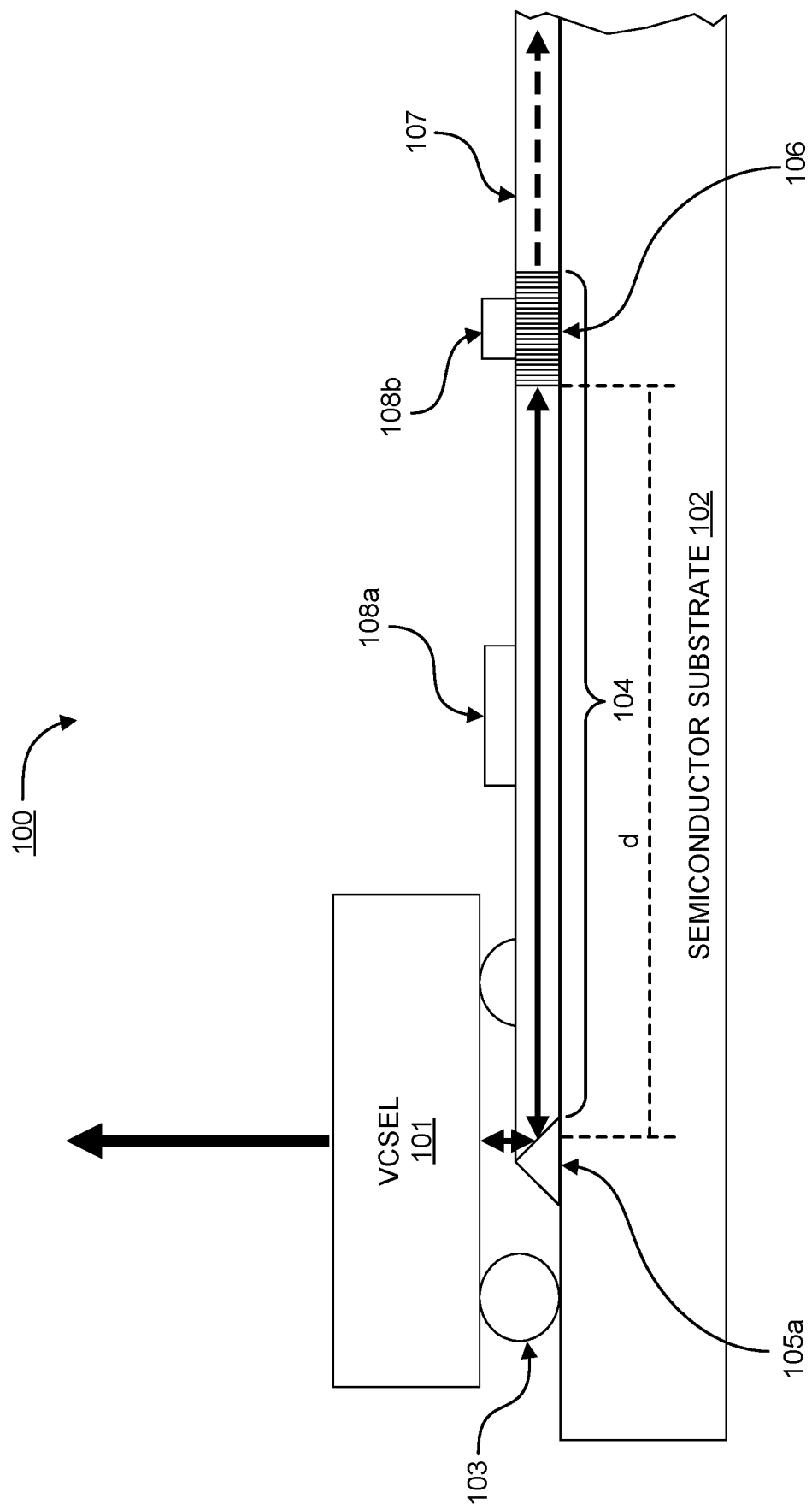
FIG. 1 illustrates an example coupled-cavity VCSEL system in accordance with embodiments of the technology disclosed herein.

The figures are not exhaustive and do not limit the present disclosure to the precise form disclosed.

DETAILED DESCRIPTION

VCSELs has found applications in various different fields, such as optical communications, medical imaging technology, and industrial processes, among others. The fabrication and performance benefits of VCSELs has increased their attractiveness over other types of lasers, such as laser diodes and edge emitting lasers. VCSELs provide high modulation bandwidth (compared to other laser devices) for low cost and power consumption. Moreover, VCSELs are generally lower loss devices compared to other lasing devices, making VCSELs well suited for optical communications. However, VCSELs are inherently limited in its modulation bandwidth to roughly 20-25 GHz due to the size of the devices. Some current approaches to increase VCSEL bandwidth have utilized adjacent VCSELs, where the resonances of the adjacent VCSELs are coupled to try and increase the bandwidth. Although VCSELs are generally low cost, the structures are complex and each VCSEL would need to be finely fabricated to ensure that the resonance frequencies of the two devices are capable of coupling to increase the modulation bandwidth.

Embodiments of the technology disclosed herein provide systems and methods for increasing modulation bandwidth utilizing a single VCSEL. As discussed in greater detail below, the technology utilizes an external cavity to increase the overall bandwidth of the VCSEL without the need to combine two or more VCSELs. For example, the external cavity and a lasing cavity of the single VSCSEL create a coupled cavity for the VCSEL, where the external cavity and the lasing cavity share a mirror. The external cavity is tuned to come close to a resonance wavelength of the VCSEL structure, enabling coupling between the resonance of the internal lasing cavity of the VCSEL structure and the external cavity. As a non-limiting example, the external cavity is tuned such that it is within 30 GHz of the resonance wavelength of the lasing cavity of the VCSEL. By extending the total distance of the lasing cavity (i.e., the combination of the internal VCSEL lasing cavity and the external cavity) the modulation bandwidth of the VCSEL is increased without the need to redesign the VCSEL structure or increase the size of the internal lasing cavity. In various embodiments, the external cavity may be separate from the VCSEL structure, wherein a coupling component may be disposed to couple light of the resonance wavelength of the VCSEL into the external cavity and from the external cavity into the VCSEL. In other embodiments, the external cavity and the VCSEL structure can be monolithically fabricated, wherein the external cavity is disposed directly on an external surface of the VCSEL to form a single device. A feedback loop in various embodiments can be used to tune the characteristics of the VCSEL and/or the external cavity such that the performance exceeds a certain high modulation bandwidth threshold. The technology disclosed herein is applicable to both top- and bottom-emitting VCSELs. Photon-photon resonance is another term to describe the modulation bandwidth enhancement of lasers by coupling them to an additional resonant cavity. One method to analyze these structures is to make one of the laser cavity mirrors frequency dependent to account for the resonance of the external cavity.

FIG. 1 illustrates an example coupled-cavity VCSEL system 100 in accordance with embodiments of the technology of the present disclosure. The example coupled-cavity VCSEL system 100 is provided for illustrative purposes and should not be interpreted as limiting the scope of the technology to only the depicted embodiment. As shown in FIG. 1, the coupled-cavity VCSEL system 100 includes a VCSEL device 101 disposed on a top surface of a semiconductor substrate 102. Although a single VCSEL device 101 is depicted in FIG. 1, this is provided for ease of discussion; in some embodiments, a plurality of VCSEL devices 101 may be disposed on the same semiconductor substrate 102. In various embodiments, the VCSEL device 101 may be connected to the semiconductor substrate 102 through one or more solder balls 103. In some embodiments, the solder balls 103 may be made of a conductive material and configured to pass one or more electrical signals to and from the VCSEL device 101. In various embodiments, the VCSEL device 101 may comprise either a top-emitting VCSEL device or a bottom-emitting VCSEL device. The VCSEL device 101 includes an internal lasing cavity (e.g., as described in more detail with respect to FIG. 4).

The semiconductor substrate 102 may comprise a photonic integrated circuit (PIC) communicatively coupled to a processing circuit (not shown in FIG. 1) in some embodiments. One or more traces may be disposed in the semiconductor substrate 102 connecting the VCSEL device 101 to one or more processing circuits. In various embodiments, the one or more processing circuits may comprise an application specific integrated circuit (ASIC), a field programmable gate array (FPGA), a general purpose processor (GPU), a central processing unit (CPU), or other processing circuitry known in the art that is configured to control operation of the VCSEL device 101. The semiconductor substrate 102 may comprise one or more types of semiconductor materials known in the art, including but not limited to gallium arsenide (GaAs), indium phosphide (InP), silicon (Si), silicon nitride (SiN), LiNbO$_3$, glass, and silica, among others.

In various embodiments, a waveguide 107 may be disposed on the semiconductor substrate 102. An external cavity 104 may be disposed within the waveguide 107. As discussed above, the overall modulation bandwidth of the VCSEL device 101 is enhanced using the technology of the present disclosure by coupling an external cavity to the internal lasing cavity of the VCSEL device 101. The external cavity 104 is optically coupled to the VCSEL device 101 such that light of a resonance wavelength of the VCSEL device 101 can leak out of the VCSEL device 101 and into the external cavity 104 through a coupling component 105. In the depicted embodiment of FIG. 1, the coupling component 105 comprises a reflector 105a configured to reflect light into and out of a bottom surface of the VCSEL device 101. In various embodiments, the reflector 105a may comprise a coupling mirror set on a 45° angle, the coupling mirror comprising a metallic-coated mirror, dielectric-coated mirror, or other types of directional mirrors. In various embodiments, the reflector 105a may be disposed on the top surface of the semiconductor substrate 102, while in other embodiments the reflector 105a may be disposed within the semiconductor substrate 102. In various embodiments, the external cavity 104 may comprise one or more materials, including but not limited to glass, polymer, semiconductor, and oxide. In various embodiments, the external cavity 104 may comprise an optical fiber buried within a cladding material, while in other embodiments the external waveguide 104 may comprise a planar, slab, or strip waveguide. In some embodiments, the external cavity 104 may be disposed within the semiconductor substrate 102.

In various embodiments, an external cavity reflector 106 is disposed at the distal end of the external cavity 104 at a distance d from the reflector 105a. In the present disclosure, the terms "distal" and "proximal" of the external cavity 104 are used in reference to the location of the VCSEL device 101. The external cavity reflector 106 forms the second cavity of the coupled-cavity arrangement of the coupled-cavity VCSEL system 100 in conjunction with a internal bottom mirror (not shown in FIG. 1) of the VCSEL device 101. In this way, the internal bottom mirror is shared between the internal lasing cavity of the VCSEL and the external cavity 104. Essentially, the coupling of the external cavity 104 to the internal lasing cavity (not shown in FIG. 1) of the VCSEL device 101 adds complexity to the second mirror (here, the bottom mirror) of the VCSEL device 101, thereby increasing the overall modulation bandwidth such that the VCSEL device 101 has a modulation bandwidth greater than the intrinsic modulation bandwidth of the VCSEL device 101. In various embodiments, the external cavity reflector 106 may comprise a distributed Bragg reflector (DBR), vertical DBR, or sideways DBR, configured to reflect light from the VCSEL device 101 back towards the VCSEL device 101. In some embodiments, the external cavity reflector 106 may be partially reflective, configured to reflect some light back towards the VCSEL device 101 and allow some light to pass through the external cavity reflector 106 to continue further along the waveguide 107 (as shown by the broken arrow in FIG. 1). Therefore, in various embodiments, the final output of the VCSEL 101 can either be output from a top surface of the VCSEL 101 or output through the partially-reflective external cavity reflector 106 along the waveguide 107. In some embodiments, output light of the VCSEL 101 may be emitted out of the top of the VCSEL 101 and out the end of the partially-reflective external cavity reflector 106 along the waveguide 107.

By tuning the resonance of the external cavity 104 to be the same or near the resonance wavelength of the VCSEL device 101, light of the resonance wavelength of the VCSEL device 101 is capable of leaking into the external cavity 104. The additional distance and reflection of the leaked resonance wavelength signal from the VCSEL device 101 increases the overall modulation bandwidth possible for the VCSEL device 101. In various embodiments, one or more tuning components 108 may be operationally coupled to the waveguide 107 and/or the external cavity reflector 106. As depicted in FIG. 1, the tuning components 108 can comprise a waveguide tuner 108a and/or a reflector tuner 108b. The waveguide tuner 108a may be configured to change a refractive index of the waveguide 107 comprising the external cavity 104 to tune the resonance wavelength of the external cavity 104. The reflector tuner 108b may be configured to tune the external cavity reflector 106 to tune the phase of the light within the external cavity 104. In various embodiments, the tuning components 108 may comprise one or more of a heater, an electrical contact for applying a current, an electromagnetic field source, among others, to take advantage of thermal effects, carrier effects, plasma dispersion effects, pockets-effect, and Kerr-effects, among other.

The resonance of the external cavity 104 and the internal lasing cavity of the VCSEL device 101 can be closely spaced together in various embodiments. Close spacing of the resonances of each cavity can increase the overall modulation bandwidth of the VCSEL device 101 without the need for the use of additional VCSELs. The photon-photon resonance of the coupled cavities can be thought of as one of the mirrors of the internal lasing cavity of the VCSEL device 101 having a more complex frequency response. The light of the VCSEL device 101 can resonate within the external cavity 104, which makes the reflectivity of the second mirror of the VCSEL device 101 frequency dependent. Over a narrow frequency bandwidth, the frequency-dependent reflectivity of the coupled internal mirror (due to the presence of the external cavity 104) can boost the overall modulation bandwidth of the VCSEL device 101.

Figure 2:
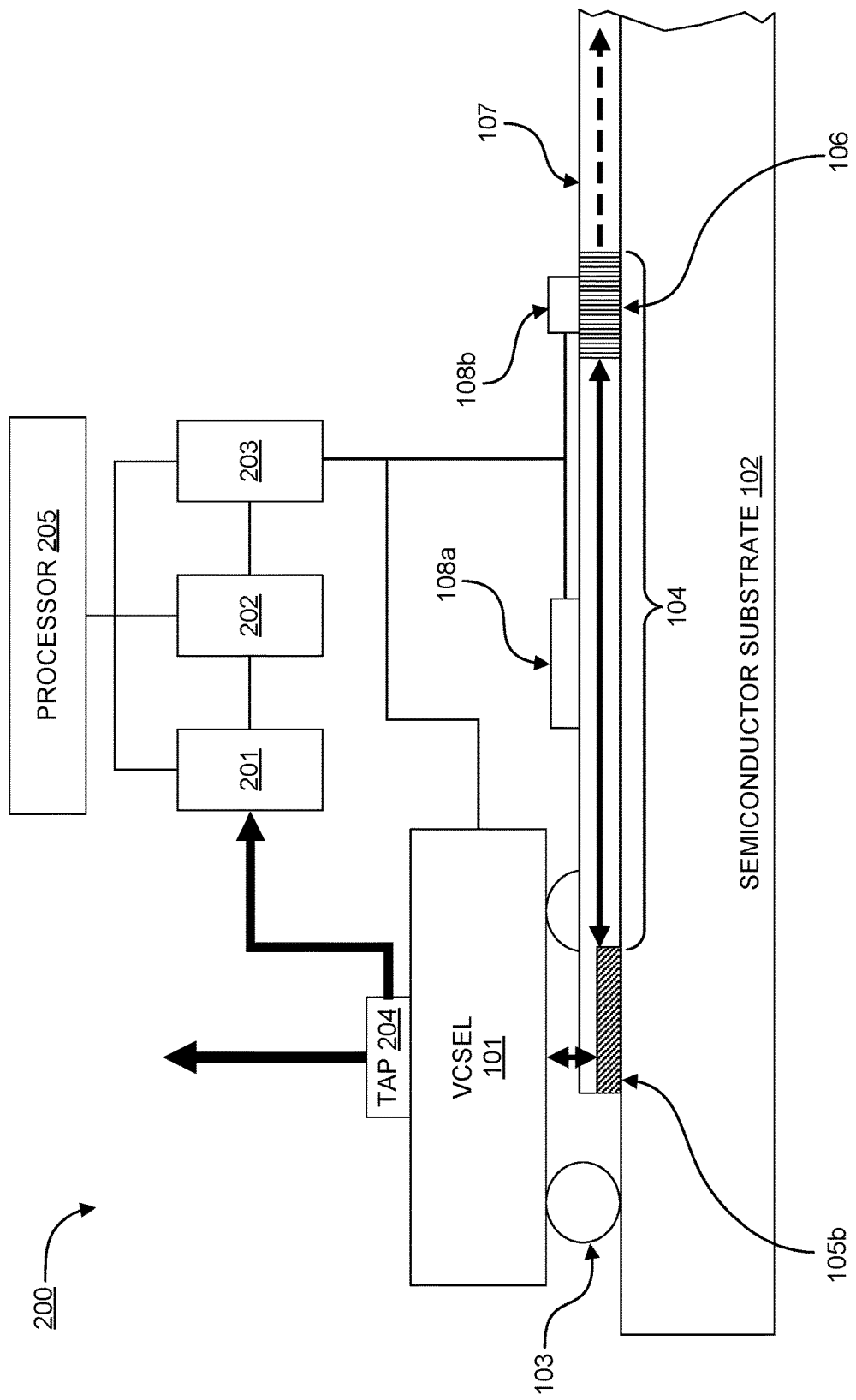
FIG. 2 illustrates another example coupled-cavity VCSEL system in accordance with embodiments of the technology disclosed herein

FIG. 2 illustrates another example coupled-cavity VCSEL system 200 in accordance with embodiments of the technology of the present disclosure. The example 200 is provided for illustrative purposes only and should not be interpreted as limiting the scope of the technology to only the depicted embodiment. Where common references are used between figures, all descriptions related to those references are applicable to all instances unless otherwise stated. As shown in FIG. 2, the coupled-cavity VCSEL system 200 is similar to the coupled-cavity VCSEL system 100 discussed with respect to FIG. 1, but with a different coupling component 105. As shown in FIG. 2, the coupling component 105b comprises a directional grating coupler 105b disposed at a proximal end of the external cavity 104. The directional grating coupler 105b can be configured to guide light of the resonance frequency into and out of the external cavity 104. In various embodiments, the directional grating coupler 105b may be imprinted into the waveguide 107, while in other embodiments the directional grating coupler 105b may be disposed on a top surface of the waveguide 107. In various embodiments, a single bidirectional grating coupler 105b may be used, while in other embodiments two unidirectional grating coupler 105b. In various embodiments, the directional grating coupler 105b can be part of the external cavity 104, and in other embodiments the directional grating coupler 105b may be a component optically connected to the external cavity.

As discussed above, the refractive index of the external cavity 104 and/or the phase of the external cavity reflector 108b may be tuned using one or more tuning components 108. Semiconductor device fabrication is not perfect, and some structures may have variations in shape, size, position, or other characteristics that fall within tolerance levels. To optimize performance within the tolerance range, the external cavity 104 and/or the VCSEL device 101 may need to be tuned. To assist in the tuning process, a feedback circuit can be included in various embodiments of the technology of the present disclosure. The feedback circuit discussed with respect to FIG. 2 is applicable to all of the embodiments disclosed herein. As depicted in FIG. 2, an optical tap 204 can be optically coupled to an output of the VCSEL device 101. The optical tap 204 can comprise one or more types of optical taps known in the art. In various embodiments, the optical tap 204 may be disposed on a top surface of the VCSEL device 101, while in other embodiments the optical tap 204 may be disposed near the waveguide 107 and optically coupled to the output end of the external cavity reflector 106.

In various embodiments, the optical tap 204 is configured to route a portion of the output light to detector component 201. In various embodiments, the detector component 201 can comprise one or more photodiodes, phototransistors, photoresistors, or other photodetector device known in the art. In various embodiments, the optical tap 204 and the detector component 201 can be incorporated in the same device. As a non-limiting example, the optical tap 204 and/or detector component 201 can comprise a semi-transparent absorbing layer built into the epi layers of the VCSEL device 101. The detector component 201 can detect the optical power of the output light and generate a signal representing the characteristics of the detected light. The generated signal can be an analog signal in some embodiments, and in other embodiments the detector component 201 may be configured to digitize detected light for processing by digital components. The generated signal is passed through a signal filter 202 configured to filter out signals above and/or below a certain threshold. In various embodiments, the signal filter 202 can comprise a high-pass filter configured to filter out frequencies higher than a target high frequency. In some embodiments, the signal filter 202 can comprise a bandpass filter configured to filter out frequencies within a range of high frequencies. In various embodiments, a "high frequency" comprises any bandwidth frequency higher than the intrinsic modulation bandwidth of the isolated VCSEL device 101. With respect to the present disclosure, a high frequency refers to a frequency that is above 25-30 GHz. If the external cavity 104 is not tuned properly to the resonance of the VCSEL device 101, the frequency content of the tapped signal can drop off at the intrinsic modulation bandwidth limit of the VCSEL device 101. Monitoring the presence of frequencies above the intrinsic modulation bandwidth of the VCSEL device enables determination if the external cavity is properly tuned and in various embodiments can be used to determine adjustments to make (using the tuning components 108) to the resonance of the external cavity. When the resonance of the external cavity 104 is tuned to be close to or at the resonance of the VCSEL device 101 higher frequency signals will be present, indicating an increase to the overall modulation bandwidth of the VCSEL device 101 above the intrinsic modulation bandwidth.

In some embodiments, the signal filter 202 may comprise one or more filter stages. As a non-limiting example, the signal filter 202 can comprise a low-pass filter stage configured to filter out frequencies below a certain threshold and a high-pass filter stage configured to filter out frequencies below a certain threshold. In various embodiments, the signal filter 202 can be configured to filter out a sinusoidal signal from the tapped optical signal from the detector component 201. In various embodiments, one or more frequencies within the intrinsic modulation bandwidth of the VCSEL device 101 may be filtered out by one or more bandpass filter stages. These low frequency signals can be used in tuning the resonance of the external cavity and/or to operational parameters of the VCSEL device 101. The low frequency signals can serve as references for varying laser output powers.

The signal filter 202 can be configured in various embodiments to create a high frequency modulation signal and/or sinusoidal signal from the detected output light from the VCSEL device 101. An amplitude monitor 203 may be configured to measure the amplitude of an input signal from the signal filter 202. The amplitude monitor 203 is configured to identify the amplitude value for the filtered input signal. Depending on the determined amplitude, the amplitude monitor 203 may be configured to send an adjustment signal to one or more tuning components or operational contacts of the VCSEL device 101 to adjust the operating parameters of the components of the coupled-cavity VCSEL system. As a non-limiting example, the amplitude monitor 203 may send a signal to one or more of the tuning components 108 to change the refractive index or phase of the external cavity 104 or the external cavity reflector 106, respectively, to more accurately tune the resonance mode of the external cavity 104 to increase the overall modulation bandwidth greater than the intrinsic modulation bandwidth of the VCSEL device 101. In some embodiments, the amplitude monitor 203 may send a signal to one or more electrical contacts (not shown in FIG. 2) of the VCSEL device 101 to control the operational characteristics of the VCSEL device 101 by applying a bias voltage to the one or more electrical contacts connected to the internal mirrors of the VCSEL device 101.

In various embodiments, the detector component 201, the signal filter 202, and/or the amplitude monitor 203 (collectively, "the feedback components") may be communicatively coupled to a processor 205. The processor 205 may be configured to control the operation of the feedback components. In some embodiments, the processor 205 may be configured to receive input from each feedback component and send a corresponding command to the next feedback component. In various embodiments, one or more of the detector component 201, the signal filter 202, and/or the amplitude monitor may be included within the processor 205. In various embodiments, the amplitude monitor 203 may be configured to send an adjustment signal to a signal generator or other computing component configured to generate one or more adjustment signals for controlling one or more tuning components 108.

The embodiments depicted in FIGS. 1 and 2 include passive components used for the external cavity 104. In various embodiments, active components may be used to create the external cavity. As a non-limited example, an external laser can be disposed within the waveguide 107 of the substrate. In such embodiments, the external lasers can inject additional output power into the VCSEL device 101, further increasing the overall modulation bandwidth of the VCSEL device 101.

Figure 3A:
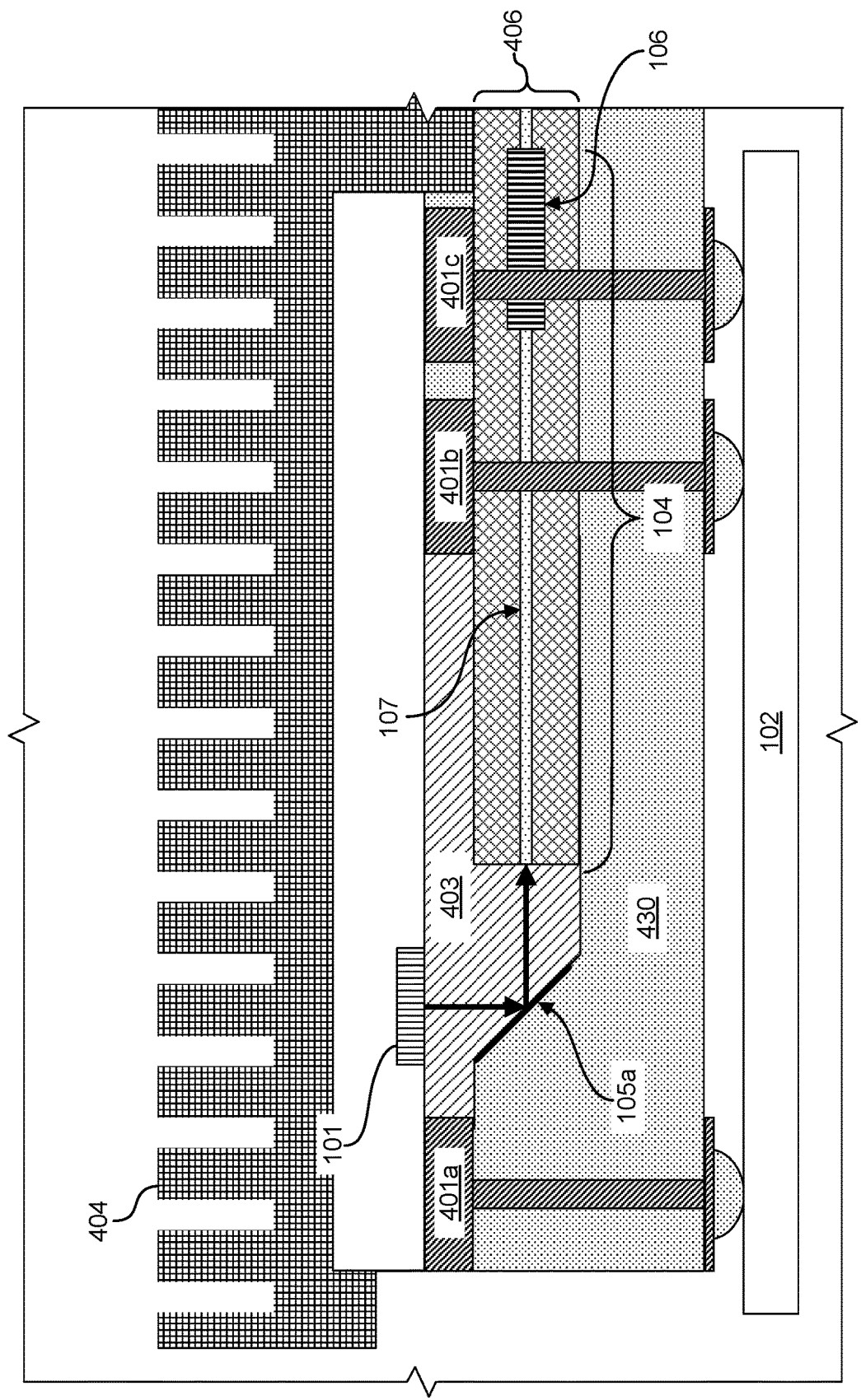
FIG. 3A illustrates a cross-sectional view of an example coupled-cavity VCSEL system in accordance with embodiments of the technology disclosed herein.

FIGS. 3A and 3B illustrate a cross-sectional and top view, respectively, of an example photonic system 400 including the coupled-cavity VCSEL system in accordance with embodiments of the technology disclosed herein. FIGS. 3A and 3B are provided for illustrative purposes only and should not be interpreted as limiting the scope of the subject matter discussed herein. Use of like references between figures indicates that the description of such like referenced elements apply equally to all instances of the reference. Various embodiments of the coupled-cavity VCSEL system disclosed in the present disclosure are applicable to the photonic system 400, including but not limited to the example coupled-cavity VCSEL system 100 and 300 discussed above with respect to FIGS. 1 and 2. As shown in FIG. 3A, the VCSEL device 101 is shown disposed on a plurality of bond pads 401, which may be similar to the metal bumps 103 discussed above with respect to FIGS. 1-3. The bond pads 401 can provide an electrical connection between the VCSEL device 101 and the semiconductor substrate 102. The semiconductor substrate 102 may be an organic substrate, inorganic substrate, a semiconductor material, or other suitable material for a printed circuit board (PCB) or other electrical mounting board.

As seen in FIG. 3A, the waveguide 107 may be disposed within a mode converter 406. The mode converter 406 can assist in guiding the signal from the VCSEL device 101 to reduce the impact of light diffraction as the signal travels from the VCSEL device 101 to the coupling component 105, and from the coupling component 105 to the waveguide 107. In various embodiments, mode converter 406 comprises silicon nitride, silicon dioxide, silicon oxynitride, a polymer or other suitable material or multiple layers of suitable materials encasing the waveguide 107. In various embodiments, and interposer 430 may be included, the VCSEL device 101, coupling component 105, and the mode converter 406 disposed on the interposer 430. In some embodiments, the mode converter 206 may be configured such that the waveguide 107 comprises an inverse taper, assisting in mode matching to reduce coupling loss.

An index-matched underfill 403 can be disposed between the VCSEL device 101 and the waveguide 107. Underfill is helpful in decreasing optical losses by removing the air waveguide interface. Index-matched underfill 403 is selected to match closely with the index of the optical mode in the waveguide 107, thereby minimizing optical loss. Heat sink 404 may be included to assist in controlling operational temperature.

The modulated light from the VCSEL device 101 is egressed to the coupling component 105, which couples the modulated light from the VCSEL device 101 into the waveguide 107. Although illustrated as a reflector 105a, the coupling component 105 may be one of the other types of coupling components discussed above with respect to FIGS. 1 and 3. In various embodiments, the VCSEL device 101 can comprise a single-mode VCSEL and the waveguide 107 can also have a single mode, while in other embodiments the VCSEL device 101 can comprise a multi-mode VCSEL and the waveguide 107 can comprises multiple modes.

As shown in FIGS. 4A and 4B, the external cavity reflector 106 can be disposed on the waveguide 107 at a distal end of the external cavity 104. The external cavity reflector 106 can be configured in a manner similar to that discussed with respect to FIGS. 1 and 2 above. In some embodiments, the external cavity reflector 106 can be configured to pass a portion of the light coupled into the waveguide 107 and reflect a portion of the light back towards the proximal end of the waveguide 107.

Figure 4:
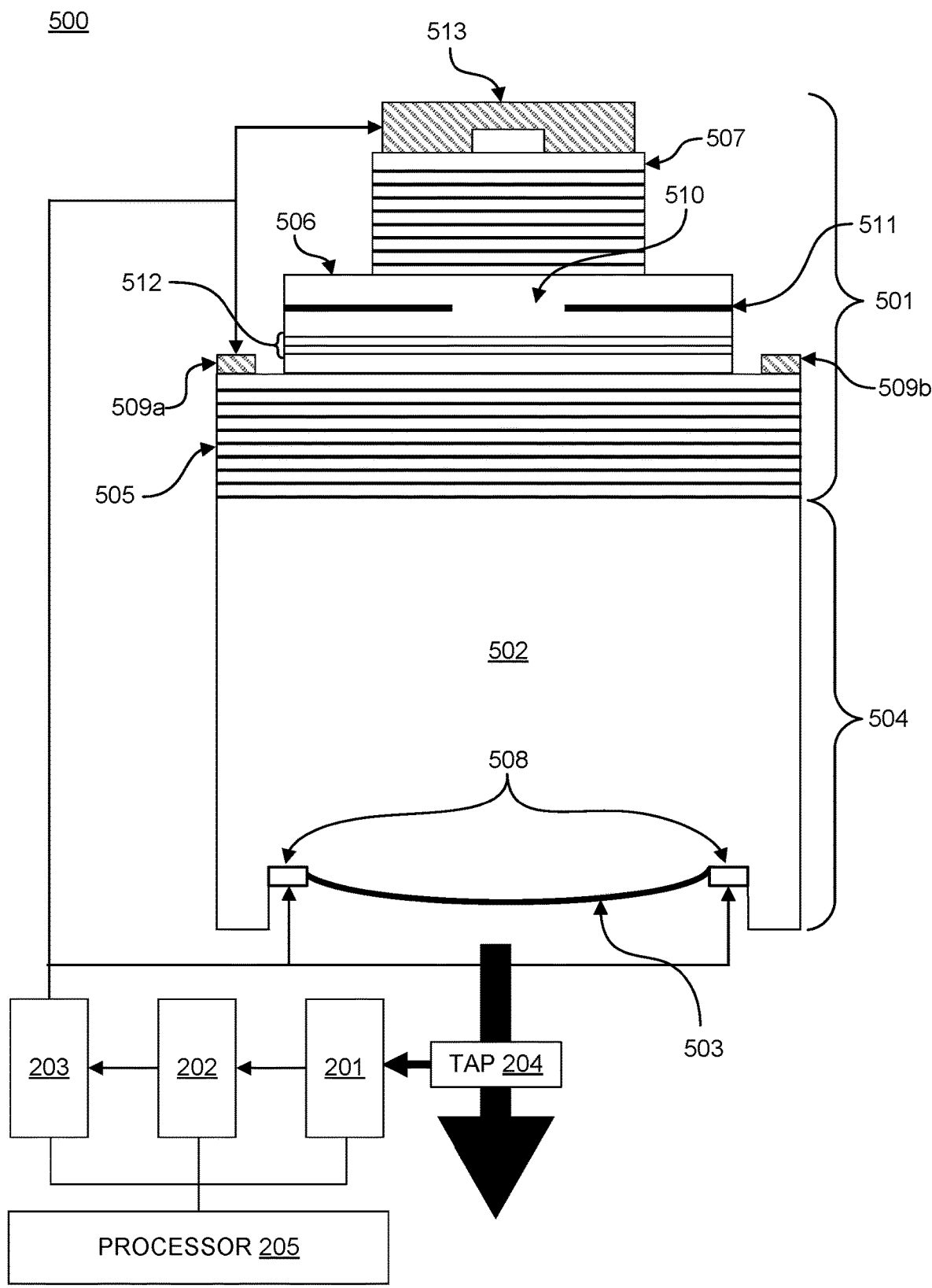
FIG. 4 is another example coupled-cavity VCSEL system in accordance with embodiments of the technology disclosed herein.

As discussed above, the coupling of two cavities together can increase the overall modulation bandwidth of the VCSEL device without the need for additional VCSEL devices or larger VCSEL devices. In various embodiments, the external cavity can be monolithically fabricated in the VCSEL structure. FIG. 4 illustrates an example monolithic coupled-cavity VCSEL device 500 in accordance with embodiments of the technology disclosed herein. The example 500 is provided for illustration purposes and should not be interpreted as limiting the scope of the technology to only the depicted embodiment. Unlike the embodiments discussed with respect to FIGS. 1-3B, the external cavity 504 of FIG. 4 is combined with the VCSEL device 501 to create a monolithic structure. In various embodiments, the external cavity 504 can comprise the VCSEL substrate 502 upon which the VCSEL structure 501 is fabricated. In various embodiments, an integrated lens 503 can be disposed at a distal end of the VCSEL substrate 502. The integrated lens 503 can comprise a curvature configured to function as a partial reflector, reflecting a first portion of light passing through a bottom mirror 505 of the VCSEL substrate 502. In some embodiments, one or more tuning components 508 may be coupled to the integrated lens 503 and configured to modify the reflectivity of the integrated lens 503.

The VCSEL structure 501 is disposed on the proximal end of the VCSEL substrate 502 in various embodiments. Disposing the VCSEL structure 501 on the VCSEL substrate 502 enables the coupling of the external cavity 504 and an internal lasing cavity of the VCSEL structure 501 formed by the bottom mirror 505, a gain material layer 506, and a top mirror 507. In this way, the benefit of the external cavity discussed above with respect to FIGS. 1-3B can be achieved within the same structure, creating a VCSEL device with overall higher modulation bandwidth than the VCSEL device alone. In various embodiments, the VCSEL structure 501 can comprise one or more additional layers and/or components. The technology disclosed herein is not dependent on the specific VCSEL structure implemented and can be used to increase the overall modulation bandwidth of any VCSEL structure. For ease of discussion, the technology of the present disclosure shall be discussed with respect to the VCSEL structure 501 depicted in FIG. 4.

In various embodiments, the bottom mirror 505 can comprise a DBR mirror similar to the DBR external cavity reflector 106 discussed with respect to FIGS. 1-3B. The bottom mirror 505 can be configured to partially reflect light passing through the gain material layer 506 while also passing a portion of the light into the VCSEL substrate 502 of the external cavity 504. In various embodiments, a first electrical contact 509 can be disposed on a top surface of the bottom mirror 505. In the cross section, the first electrical contact 509 is illustrated as two contacts 509a, 509b. In various embodiments, the first electrical contact 509 can comprise an n-type contact, and a second electrical contact 513 disposed on a top surface of the top mirror 507 can comprise a p-type contact. The bias voltage applied to the first and second electrical contacts 509, 513 can control the operation of the VCSEL structure 501.

The gain material layer 506 can be disposed on the top surface of the bottom mirror 505. In various embodiments, a gain medium 512 can be disposed within the gain material layer 506. The gain medium 512 can comprise a quantum well, quantum dot, or other known gain material used in VCSELs or other laser devices. An oxide 511 disposed above the gain medium 512 within the gain material layer 506 can be used to form an aperture 510. In various embodiments, the aperture 511 may have one or more geometries, including but not limited to circular, elliptical, asymmetrical, or comprise a plurality of different geometries.

The top mirror 507 can be disposed on a top surface of the gain material layer 506. In various embodiments, the top mirror 507 may be similar in structure as the bottom mirror 505, while in other embodiments the top mirror 507 may comprise a different mirror structure compared to the bottom mirror 505. In various embodiments, light may leak out of the top mirror 507. Although the optical tap 204 is shown as being optically coupled to the integrated lens 503, in some embodiments the optical tap 204 may be optically coupled to the leaked signal of the top mirror 507.

Monolithically fabricating the coupled-cavity VCSEL device 500 in this manner eliminates the need for the coupling component 105 discussed with respect to FIGS. 1-3B. This reduces alignment complexity required to ensure that light is properly coupled into the external cavity 504. Rather, the external cavity 504 is directly coupled to the output end of the bottom mirror 505. Moreover, the monolithic structure reduces the amount of surface area required for increasing the overall modulation bandwidth of a single VCSEL structure 501.

Figure 5:
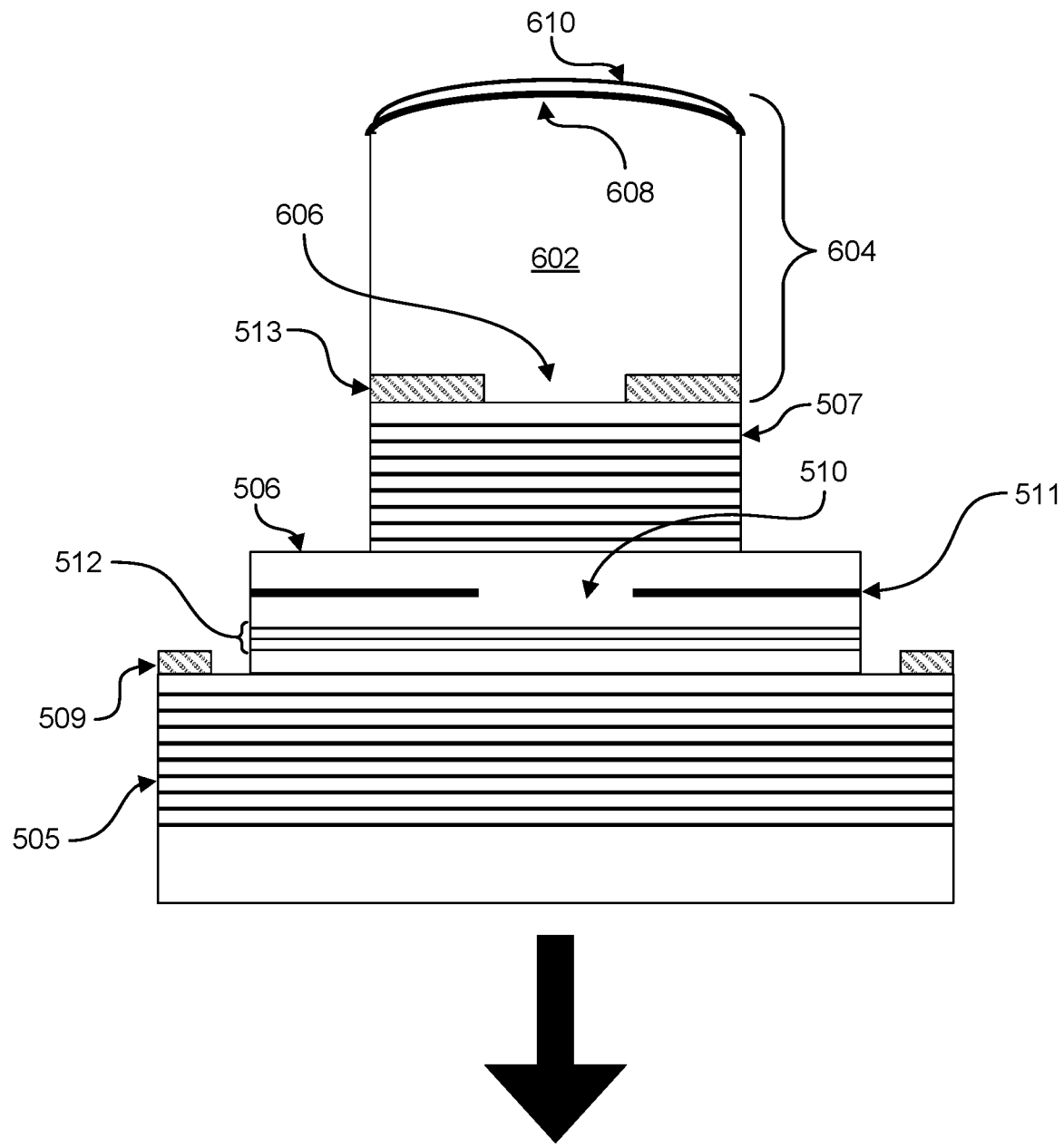
FIG. 5 illustrates another example coupled cavity VCSEL system in accordance with embodiments of the technology disclosed herein.

In various embodiments, the external cavity can be disposed on a top surface of a VCSEL structure 501. FIG. 5 illustrates another example monolithic coupled-cavity VCSEL device 600 in accordance with the technology of the present disclosure. The monolithic coupled-cavity VCSEL device 600 is provided for illustrative purposes only and should not be interpreted as limiting the scope of the technology to only the depicted embodiment. The example 600 includes many of the same elements as those discussed with respect to FIG. 4 and the discussion with respect to common elements should be interpreted as applicable to the example 600 unless stated otherwise. As shown in FIG. 5, the external cavity 604 is disposed on a top surface of the top mirror 507. The external cavity 604 can comprise an external substrate 602. In various embodiments, the external substrate 602 can comprise a material similar to the VCSEL substrate 502 discussed with respect to FIG. 4. In some embodiments, an opening 606 may be disposed within the second electrical contact 513 such that the external substrate 602 can be disposed on the top mirror 507 and light may leak out of the second mirror 507 into the external substrate 602. Light leaked into the external substrate 602 can be reflected back towards the second mirror 507 by a reflector 608 disposed on a top surface of the external substrate 602. In various embodiments, the reflector 608 can be configured with a curvature configured to concentrate the reflected light into the opening 606 and back through the second mirror 507. In various embodiments, a heater 610 or other tuning component can be disposed on the reflector 608 to control the reflectivity and the reflector 608.

The reflected light passes through the second mirror 507 and is modulated by the gain material 512 to increase the overall modulation bandwidth of the light emitted from the VCSEL structure 501 through the first mirror 505. In various embodiments, the feedback circuitry discussed with respect to FIG. 2 can include an optical tap disposed on the output of the bottom mirror 505 of the VCSEL structure 501 to route a portion of the output light to the signal filter. In other embodiments, the optical tap may be connected to light leaked out of the reflector 608 of the external cavity 604. In such embodiments, the reflector 608 can be configured to partially reflect light while letting a portion of the light leak out of the external cavity 604.

As discussed above, using an external cavity that is coupled to an internal lasing cavity of the VCSEL structure can increase the overall modulation bandwidth of the VCSEL without the need for an additional VCSEL device and/or changes to the internal structure of the VCSEL. In this way, the increase is achievable without an increase in the overall power consumption because fewer devices are required to achieve the desired target high modulation bandwidth.

It should be noted that the terms "optimize," "optimal" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A device comprising:
   a vertical cavity surface emitting laser (VCSEL) comprising:
      a first mirror;
      a gain medium disposed above the first mirror; and
      a second mirror disposed above the gain medium, wherein a first cavity is formed by the first mirror and the second mirror;
   a second cavity optically coupled to the VCSEL and configured to reflect light emitted from the VCSEL back into the first cavity of the VCSEL;
   one or more tuning components disposed on the second cavity, wherein the one or more tuning components tunes a resonance of the second cavity to a resonance of the first cavity of the VCSEL; and
   a feedback control loop comprising:
      a signal filter coupled to an output of the VCSEL configured to filter out a measurement signal from the output of the VCSEL, the measurement signal comprising a frequency of the output of the VCSEL corresponding to a target high frequency signal;
      a measurement circuit configured to measure an amplitude of the measurement signal; and
      an adjustment circuit connected to the measurement circuit and configured to send an adjustment signal to the one or more tuning components in response to an output signal from the measurement circuit.

2. The device of claim 1, wherein the second cavity comprises an external cavity of a waveguide disposed on a substrate.

3. The device of claim 2, wherein the external cavity comprises a third mirror disposed on a distal end away from the VCSEL.

4. The device of claim 2, further comprising:
   a coupling component disposed on a proximal end of the waveguide,
   wherein the coupling component is configured to couple light of the resonance from the VCSEL into the waveguide and from the waveguide into the VCSEL.

5. The device of claim 4, wherein the VCSEL is a single-mode VCSEL.

6. The device of claim 4, wherein the VCSEL is a multi-mode VCSEL.

7. The device of claim 6, wherein the one or more tuning components tune the external cavity to a plurality of modes of the multi-mode VCSEL.

8. The device of claim 4, wherein the feedback control loop further comprises:
   a tap optically coupled to the output of the VCSEL and configured to divert a portion of the light emitted from the VCSEL; and
   a photodetector coupled to an output end of the tap and configured to output a detected signal,
   wherein the signal filter is coupled to an output of the photodetector configured to filter out the measurement signal from the detected signal.

9. The device of claim 1, wherein the signal filter comprises one or more of a high-pass filter, a bandpass filter, or a low-pass filter.

10. The device of claim 1, wherein the second cavity and the VCSEL comprise a monolithic structure.

11. The device of claim 10, wherein the second cavity comprises a VCSEL substrate disposed below the first mirror and a partial reflector lens disposed underneath the VCSEL substrate.

12. The device of claim 11, wherein the partial reflector lens is configured to reflect a portion of light that passed through the first mirror and the VCSEL substrate such that the portion of light is reflected through the VCSEL substrate and the first mirror into the first cavity.

13. The device of claim 10, wherein the second cavity comprises an external substrate disposed above the second mirror and a third mirror disposed above the external substrate.

14. The device of claim 13, wherein the third mirror is configured to reflect a portion of light passed through the second mirror and the external substrate such that the portion of light is reflected through the external substrate and the second mirror into the first cavity.

15. A device comprising:
   a vertical cavity surface emitting laser (VCSEL) having a first cavity, the VCSEL being disposed on a surface of a substrate;
   a waveguide disposed on the surface of the substrate;
   a mirror disposed on a distal end of the waveguide;
   a coupling component disposed on a proximal end of the waveguide;
   one or more tuning components disposed on the waveguide, wherein the one or more tuning components tunes the waveguide to a resonance of the VCSEL and the coupling component is configured to couple light of the resonance from the VCSEL into the waveguide and from the waveguide into the VCSEL; and
   a feedback control loop comprising:
      a signal filter coupled to an output of the VCSEL configured to filter out a measurement signal from the output of the VCSEL, the measurement signal comprising a frequency of the output of the VCSEL corresponding to a target high frequency signal;
      a measurement circuit configured to measure an amplitude of the measurement signal; and
      an adjustment circuit connected to the measurement circuit and configured to send an adjustment signal to the one or more tuning components in response to an output signal from the measurement circuit.

16. The device of claim 15, wherein the mirror comprises a distributed Bragg reflector (DBR).

17. The device of claim 16, wherein the mirror is configured to reflect a first portion of the light coupled from the VCSEL and pass a second portion of the light coupled from the VCSEL into a non-cavity waveguide.

18. The device of claim 15, wherein the coupling component comprises a 45° mirror.

19. A vertical cavity surface emitting laser (VCSEL) comprising:
a first mirror;
a gain medium disposed above the first mirror;
a second mirror disposed above the gain medium, wherein a first cavity is formed by the first mirror and the second mirror; and
a second cavity optically coupled to the first cavity, the second cavity comprising a reflective component and a substrate structure, wherein the second cavity is configured to reflect light emitted from the first cavity back into the first cavity, wherein
the second cavity comprises one or more tuning components disposed thereon configured to tune a resonance of the second cavity to a resonance of the first cavity,
a signal filter is coupled to an output of the VCSEL configured to filter out a measurement signal from the output of the VCSEL, the measurement signal comprising a frequency of the output of the VCSEL corresponding to a target high frequency signal,
a measurement circuit is connected to the signal filter and configured to measure an amplitude of the measurement signal, and
an adjustment circuit is connected to the measurement circuit and configured to send an adjustment signal to the one or more tuning components in response to an output signal from the measurement circuit.

20. The VCSEL of claim 19, wherein the VCSEL is a bottom-emitting VCSEL, the bottom-emitting VCSEL further comprising:
the first mirror disposed above the substrate structure; and
the substrate structure disposed above the reflective component,
wherein the reflective component comprises a partial reflector lens having a curvature configured to reflect a first portion of light emitted through the first mirror from the first cavity back through the first mirror into the first cavity.

\* \* \* \* \*